US007439654B2

(12) United States Patent

McDermott et al.

(10) Patent No.: US 7,439,654 B2

(45) Date of Patent: Oct. 21, 2008

(54) TRANSMISSION OF ULTRASONIC ENERGY INTO PRESSURIZED FLUIDS

(75) Inventors: Wayne Thomas McDermott, Fogelsville, PA (US); Dean Van-John Roth, Center Valley, PA (US); Richard Carl Ockovic, Northampton, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 683 days.

(21) Appl. No.: 10/785,298

(22) Filed: Feb. 24, 2004

(65) Prior Publication Data

US 2005/0183739 A1 Aug. 25, 2005

(51) Int. Cl.
*H01L 41/04* (2006.01)

(52) U.S. Cl. .................................. 310/323.19; 310/334

(58) Field of Classification Search ............ 310/323.19, 310/334

See application file for complete search history.

(56) References Cited

U.S. PATENT DOCUMENTS

| | | | | | |
|---|---|---|---|---|---|
| 3,131,515 | A | * | 5/1964 | Mason | 310/323.19 |
| 3,184,842 | A | * | 5/1965 | Maropis | 310/323.19 |
| 3,381,525 | A | * | 5/1968 | Kartluke et al. | 310/323.19 |
| 3,433,226 | A | | 3/1969 | Boyd | |
| 3,475,628 | A | * | 10/1969 | McMaster et al. | 310/323.19 |
| 3,546,498 | A | * | 12/1970 | McMaster et al. | 310/323.19 |
| 3,628,071 | A | * | 12/1971 | Harris et al. | 310/323.19 |
| 4,193,009 | A | * | 3/1980 | Durley, III | 310/323.19 |
| 4,251,031 | A | | 2/1981 | Martin et al. | |
| 4,272,200 | A | * | 6/1981 | Hehl | 310/323.19 |
| 4,425,115 | A | | 1/1984 | Wuchinich | |
| 4,486,680 | A | * | 12/1984 | Bonnet et al. | 310/323.19 |
| 4,537,511 | A | | 8/1985 | Frei | |
| 4,583,101 | A | * | 4/1986 | Braun | 310/323.19 |
| 5,013,366 | A | | 5/1991 | Jackson et al. | |
| 5,144,771 | A | | 9/1992 | Miwa | |
| 5,337,446 | A | | 8/1994 | Smith et al. | |
| 5,377,705 | A | | 1/1995 | Smith, Jr. et al. | |
| 5,522,938 | A | | 6/1996 | O'Brien | |
| 5,866,004 | A | | 2/1999 | Houck | |
| 6,039,059 | A | | 3/2000 | Bran | |
| 6,140,744 | A | * | 10/2000 | Bran | 310/323.19 |

(Continued)

FOREIGN PATENT DOCUMENTS

DE 260 6997 8/1977

(Continued)

OTHER PUBLICATIONS

U.S. Appl. No. 10/253,054, filed Sep. 24, 2002, McDermott et al.

(Continued)

*Primary Examiner*—Jaydi A San Martin
(74) *Attorney, Agent, or Firm*—Lina Yang

(57) ABSTRACT

Ultrasonic probe comprising an elongate body having a first end and a second end, an ultrasonic transducer attached to the probe at or adjacent the first end, and an enlarged support section intermediate the ultrasonic transducer and the second end, wherein the enlarged support section has an equivalent diameter greater than an equivalent diameter of the body at any location between the enlarged support section and the ultrasonic transducer. The probe may be used to introduce ultrasonic energy into ultrasonic cleaning systems.

12 Claims, 8 Drawing Sheets

U.S. PATENT DOCUMENTS

| | | | | |
|---|---|---|---|---|
| 6,204,592 | B1 * | 3/2001 | Hur | 310/323.19 |
| 6,228,563 | B1 | 5/2001 | Starov et al. | |
| 6,333,268 | B1 | 12/2001 | Starov et al. | |
| 6,357,142 | B1 | 3/2002 | Bergman et al. | |
| 6,617,760 | B1 * | 9/2003 | Peterson et al. | 310/323.19 |
| 6,652,992 | B1 * | 11/2003 | Gunnerman | 310/323.19 |
| 6,984,921 | B1 * | 1/2006 | Kosterman | 310/323.19 |
| 7,156,189 | B1 * | 1/2007 | Bar-Cohen et al. | 310/323.19 |
| 7,157,058 | B2 * | 1/2007 | Marhasin et al. | 310/323.19 |
| 2003/0116176 | A1 | 6/2003 | Rothman et al. | |
| 2004/0094183 | A1 | 5/2004 | Ching et al. | |

FOREIGN PATENT DOCUMENTS

| | | | |
|---|---|---|---|
| DE | 2613614 | | 10/1977 |
| EP | 0 816 000 | A1 | 1/1998 |
| JP | 2003-31547 | A | 1/2003 |
| JP | 2004-050796 | | 2/2004 |
| KR | 20-2001-0010992 | | 10/2001 |
| KR | 1020020047724 | | 6/2002 |

OTHER PUBLICATIONS

Ti Trofimov et al., "Ultrasound Enhancement of Dissolution Kinetics of Uranium Oxides in Supercritical Carbon Dioxide", *Journal of Chemical Technology and Biotechnology*, J Chem Technol Biotechnol 76: 1223-1226 (online: 2001).

J P Perkins, "Practice and Application", based on a paper presented at the Sonochemistry Symposium, Annual Chemical Congress, held at Warwick University, UK, Apr. 8-11, 1986.

* cited by examiner

TRANSMISSION OF ULTRASONIC ENERGY INTO PRESSURIZED FLUIDS

BACKGROUND OF THE INVENTION

Ultrasonic energy is used to promote mass transfer and chemical reactions in fluid systems for a wide variety of applications. One of these applications is ultrasonic cleaning, in which articles are immersed in a fluid bath while ultrasonic energy is introduced into the bath to enhance the cleaning process. Ultrasonic cleaning systems range from small countertop units used in dental offices and laboratories to large industrial units used in the food and chemical process industries. Ultrasonic cleaning systems also are used in the fabrication of electronic components to remove residues from parts and components following manufacturing steps such as lithography, etching, stripping, and chemical mechanical planarization. In another application, ultrasonic energy is used in sonochemical reactor systems to promote chemical reactions in fluid reaction media.

Many ultrasonic cleaning systems use a fluid bath at atmospheric pressure for immersing articles during cleaning. Other ultrasonic cleaning systems are operated at elevated pressures using pressurized liquids, condensing pressurized vapors, dense fluids, or supercritical fluids to effect cleaning of the articles in a pressurized vessel. Such pressurized ultrasonic cleaning systems are used, for example, in the electronics manufacturing industries to remove residues from parts and components during various fabrication steps. Pressurized ultrasonic processing systems may be used in the chemical industry to promote chemical reactions in sonochemical reaction systems.

Ultrasonic energy can be introduced into fluids by several methods. In one method, ultrasonic generators are submerged in the fluid and operated in situ to generate and transmit ultrasonic energy directly to the fluid. In another method, ultrasonic generators are attached to the outer surface of the vessel walls and the ultrasonic energy is transmitted through the vessel walls and into the fluid. In yet another method, ultrasonic energy is transmitted from external ultrasonic transducers via ultrasonic probes or horns passing through the vessel wall, wherein the ultrasonic energy is dissipated from the horns into the fluid.

The successful operation of high-pressure fluid processes with ultrasonic energy will require careful design of the ultrasonic probes that transmit the ultrasonic energy from an external transducer into the pressurized process fluid in a pressure vessel. There is a need in the art for new and improved designs for these ultrasonic probes and for appropriate seals to secure these probes in pressure vessel walls during pressurized operation.

BRIEF SUMMARY OF THE INVENTION

These design requirements for ultrasonic probes and seals are met by the embodiments of the present invention. In one embodiment, a specifically designed ultrasonic probe comprises an elongate body having a first end and a second end, an ultrasonic transducer attached to the probe at or adjacent the first end, and an enlarged support section intermediate the ultrasonic transducer and the second end, wherein the enlarged support section has an equivalent diameter greater than an equivalent diameter of the body at any location between the enlarged support section and the ultrasonic transducer. This ultrasonic probe may be installed in a seal assembly which in turn may be installed in the wall of a pressure vessel.

The seal assembly comprises a seal body having a first end and a second end, an axis passing through the first end and the second end, and a coaxial cylindrical passage within the seal assembly between the first end and the second end. An elastomeric sealing ring is placed around the probe adjacent the enlarged support section and the ultrasonic probe is inserted in the passage in the seal assembly, wherein the elastomeric sealing ring is disposed between the enlarged support section of the probe and the second end of the seal assembly. When the seal assembly is installed in the wall of a pressurized vessel, the outward axial force on the probe caused by the pressure differential across the seal compresses the elastomeric sealing ring between the enlarged support section and the second end of the seal assembly. This forms a seal and also prevents the probe from being forced out of the seal body by the pressure differential.

An embodiment of the invention includes an ultrasonic probe comprising an elongate body having a first end and a second end, an ultrasonic transducer attached to the probe at or adjacent the first end, and an enlarged support section intermediate the ultrasonic transducer and the second end, wherein the enlarged support section has an equivalent diameter greater than an equivalent diameter of the body at any location between the enlarged support section and the ultrasonic transducer. The ultrasonic transducer may be a piezoelectric transducer or a magnetostrictive transducer. When the ultrasonic transducer is a magnetostrictive transducer, it may be formed by an electrical coil wrapped around a section of the probe between the first end and the enlarged support section. The probe may comprise a metal or metal alloy.

The probe may have a circular cross section at any location between the first end and the second end, the cross section being defined as a section perpendicular to an axis defined by the first end and the second end. At least a portion of the probe between the enlarged support section and the second end may be cylindrical, wherein the diameter of the probe decreases discontinuously in this portion. Alternatively, the probe may have a circular cross section at all locations between the enlarged support section and the second end, wherein the diameter of the probe decreases continuously between the enlarged support section and the second end. The ratio of the distance between the first end and the enlarged support section to the distance from the enlarged support section to the second end may be between 1:10 and 10:1 Optionally, the probe may further comprise a detachable tip attached to the second end of the probe.

A related embodiment of the invention includes an ultrasonic probe comprising an elongate body having a first end and a second end, an ultrasonic transducer attached to the probe at or adjacent the first end, a cylindrical collar support section intermediate the ultrasonic transducer and the second end, wherein the probe is cylindrical between the first end and the collar support section, and wherein the collar support section has a diameter greater than diameter of the cylinder between the collar support section and the ultrasonic transducer.

An alternative embodiment relates to an ultrasonic probe comprising (a) an elongate planar body having a first end, a second end opposite the first end, a third end intersecting the first and second ends, a fourth end opposite the third end and intersecting the first and second ends, a first side intersecting the first, second, third, and fourth ends, and a second side opposite the first side and intersecting the first, second, third, and fourth ends;

(b) attachment means on the first end adapted for attaching the first end to one or more transducer assemblies;

(c) a first longitudinal shoulder support section projecting from the first side, extending linearly between the third and fourth ends, and having an outer edge; and (d) a second longitudinal shoulder support section projecting from the second side, extending linearly between the third and fourth ends, and having an outer edge, wherein the second longitudinal shoulder support section is disposed opposite the first longitudinal shoulder support section.

The distance between the outer edge of the first longitudinal shoulder support section and the outer edge of the second longitudinal shoulder support section may be greater than the thickness of the planar body at any location between the longitudinal shoulder supports and the first end, the thickness of the planar body being defined as the perpendicular distance between the first and second sides.

In another embodiment of the invention, an ultrasonic probe assembly comprises (a) a seal assembly comprising a seal body having a first end and a second end, an axis passing through the first end and the second end, and a coaxial cylindrical passage within the seal assembly between the first end and the second end;

(b) An ultrasonic probe comprising an elongate body having a first end and a second end, an ultrasonic transducer attached to the probe at or adjacent the first end, and a cylindrical collar support section intermediate the ultrasonic transducer and the second end, wherein the probe is cylindrical between the ultrasonic transducer and the collar support section, the collar support section has a diameter greater than diameter of the cylinder between the collar support section and the ultrasonic transducer, the cylindrical section of the probe is disposed coaxially within the cylindrical passage of the seal body such that the shoulder support section is adjacent the second end of the seal body, and the diameter of the cylindrical shoulder section is greater than the diameter of the cylindrical passage at the second end of the seal body; and (c) an elastomeric torroidal seal ring disposed coaxially between the collar support section of the ultrasonic probe and the second end of the seal body.

The cylindrical section of the ultrasonic probe typically extends beyond the first end of the seal body; the ultrasonic probe assembly may further comprise a compression fitting adapted to grip the ultrasonic probe and the first end of the seal body to maintain the ultrasonic probe in a coaxial position in the cylindrical passage of the seal assembly. The ultrasonic probe and the seal body may comprise a metal or metal alloy. The ultrasonic probe assembly may further comprise a transducer assembly attached to the first end thereof.

The elastomeric torroidal seal ring may comprise an elastomer selected from the group consisting of tetrafluoroethylene, chlorotrifluoroethylene, polyvinylidene fluoride, perfluoroalkoxy, polyethylene, unplasticized polyvinyl chloride, acrylonitrile butadiene styrene, acetal, cellulose acetate butyrate, nylon, polypropylene, polycarbonate, polyphenylene oxide, polyphenylene sulfide, polysulfone, polyamide, polyimide, thermosetting plastic, natural rubber, hard rubber, chloroprene, neoprene, styrene rubber, nitrile rubber, butyl rubber, silicone rubber, chlorosulfonated polyethylene, polychlorotrifluoroethylene, polyvinyl chloride elastomer, cis-polybutadiene, cis-polyisoprene, ethylene-propylene rubbers, carbon, and graphite.

The compression fitting may include a torroidal elastomeric ferrule comprising an elastomer typically selected from the group consisting of tetrafluoroethylene, chlorotrifluoroethylene, polyvinylidene fluoride, perfluoroalkoxy, polyethylene, unplasticized polyvinyl chloride, acrylonitrile butadiene styrene, acetal, cellulose acetate butyrate, nylon, polypropylene, polycarbonate, polyphenylene oxide, polyphenylene sulfide, polysulfone, polyamide, polyimide, thermosetting plastic, natural rubber, hard rubber, chloroprene, neoprene, styrene rubber, nitrile rubber, butyl rubber, silicone rubber, chlorosulfonated polyethylene, polychlorotrifluoroethylene, polyvinyl chloride elastomer, cis-polybutadiene, cis-polyisoprene, ethylene-propylene rubber, carbon, and graphite.

Another embodiment of the invention includes an ultrasonic processing system comprising (a) An ultrasonic probe assembly including (1) a seal assembly comprising a seal body having a first end and a second end, an axis passing through the first end and the second end, and a coaxial cylindrical passage disposed between the first end and the second end;

(2) An ultrasonic probe comprising an elongate body having a first end and a second end, an ultrasonic transducer attached to the probe at or adjacent the first end, and a cylindrical collar support section intermediate the ultrasonic transducer and the second end, wherein the probe is cylindrical between the ultrasonic transducer and the collar support section, the collar support section has a diameter greater than diameter of the cylinder between the collar support section and the ultrasonic transducer, the cylindrical section of the probe is disposed coaxially within the cylindrical passage of the seal body such that the shoulder support section is adjacent the second end of the seal body, and the diameter of the cylindrical shoulder section is greater than the diameter of the cylindrical passage at the second end of the seal body; and (3) an elastomeric torroidal seal ring disposed coaxially between the collar support section of the ultrasonic probe and the second end of the seal body;

(b) a pressure vessel having an interior, an exterior, and at least one opening between the interior and the exterior; and (c) first sealing means associated with the second end of the seal assembly and second sealing means associated with the at least one opening in the pressure vessel, wherein the first and second sealing means are adapted to form a seal between the seal assembly and the pressure vessel;

wherein the elastomeric torroidal seal ring is compressed between the collar support section and the second end of the seal body to form a seal between the interior and the exterior of the pressure vessel, and wherein the second end of the ultrasonic probe is disposed in the interior of the pressure vessel.

The cylindrical section of the ultrasonic probe typically extends beyond the first end of the seal body and the ultrasonic probe assembly may further comprise a compression fitting adapted to grip the ultrasonic probe and the first end of the seal body to maintain the ultrasonic probe in a coaxial position in the cylindrical passage of the seal assembly. The ultrasonic probe assembly may further comprise a transducer assembly attached to the first end thereof.

The pressure vessel may further comprise an inlet for introducing a fresh cleaning fluid into the pressure vessel and an outlet for withdrawing a contaminated cleaning fluid from the pressure vessel. The pressure vessel may further comprise an inlet port for introducing one or more contaminated articles into the pressure vessel and an outlet port for withdrawing one or more cleaned articles from the pressure vessel.

Another related embodiment of the invention includes a method of providing ultrasonic energy to a pressurized fluid comprising (a) providing an ultrasonic pressure vessel system including
  (1) an ultrasonic probe assembly including
    (1a) a seal assembly comprising a seal body having a first end and a second end, an axis passing through the first end and the second end, and a coaxial cylindrical passage disposed between the first end and the second end;
    (1b) An ultrasonic probe comprising an elongate body having a first end and a second end, an ultrasonic transducer attached to the probe at or adjacent the first end, and a cylindrical collar support section intermediate the ultrasonic transducer and the second end, wherein the probe is cylindrical between the ultrasonic transducer and the collar support section, the collar support section has a diameter greater than diameter of the cylinder between the collar support section and the ultrasonic transducer, the cylindrical section of the probe is disposed coaxially within the cylindrical passage of the seal body such that the shoulder support section is adjacent the second end of the seal body, and the diameter of the cylindrical shoulder section is greater than the diameter of the cylindrical passage at the second end of the seal body; and
    (1c) an elastomeric torroidal seal ring disposed coaxially between, and forming a seal between, the collar support section of the ultrasonic probe and the second end of the seal body;
  (2) a pressure vessel having an interior, an exterior, and at least first and second openings between the interior and the exterior; and
  (3) first sealing means associated with the second end of the seal assembly and second sealing means associated with the first opening in the pressure vessel, wherein the first and second sealing means are adapted to form a seal between the seal assembly and the pressure vessel, wherein the elastomeric torroidal seal ring is compressed between the collar support section and the second end of the seal body to form a seal between the interior and the exterior of the pressure vessel, and wherein the second end of the ultrasonic probe is disposed in the interior of the pressure vessel;
(b) introducing a pressurized fluid via the second opening into the interior of the pressure vessel;
(c) providing electrical power to the ultrasonic transducer to generate ultrasonic energy; and
(d) transmitting the ultrasonic energy through the ultrasonic probe to the pressurized fluid in the interior of the pressure vessel.

The pressure of the pressurized fluid in the interior of the pressure vessel may be in the range of $10^{-3}$ to 680 atma. The ultrasonic energy typically is provided in a frequency range of 20 KHz to 2 MHz. The ultrasonic energy may be provided at a power density in the range of 0.1 to 10,000 W/in$^2$.

The pressurized fluid may comprise one or more components selected from the group consisting of carbon dioxide, nitrogen, methane, oxygen, ozone, argon, hydrogen, helium, ammonia, nitrous oxide, hydrogen fluoride, hydrogen chloride, sulfur trioxide, sulfur hexafluoride, nitrogen trifluoride, monofluoromethane, difluoromethane, tetrafluoromethane, trifluoromethane, trifluoroethane, tetrafluoroethane, pentafluoroethane, perfluoropropane, pentafluoropropane, hexafluoroethane, hexafluoropropylene, hexafluorobutadiene, octafluorocyclobutane, and tetrafluorochloroethane. The pressurized fluid may further comprise one or more processing agents selected from a group consisting of an acetylenic alcohol, an acetylenic diol, a dialkyl ester, hydrogen fluoride, hydrogen chloride, chlorine trifluoride, nitrogen trifluoride, hexafluoropropylene, hexafluorobutadiene, octafluorocyclobutane tetrafluorochloroethane, fluoroxytrifluoromethane ($CF_4O$), bis(difluoroxy)methane ($CF_4O_2$), cyanuric fluoride ($C_3F_3N_3$), oxalyl fluoride ($C_2F_2O_2$), nitrosyl fluoride (FNO), carbonyl fluoride ($CF_2O$), perfluoromethylamine ($CF_5N$), an ester, an ether, an alcohol, a nitrile, a hydrated nitrile, a glycol, a monester glycol, a ketone, a fluorinated ketone, a tertiary amine, an alkanolamine, an amide, a carbonate, a carboxylic acid, an alkane diol, an alkane, a peroxide, a water, an urea, a haloalkane, a haloalkene, a beta-diketone, a carboxylic acid, an oxine, a tertiary amine, a tertiary diamine, a tertiary triamine, a nitrile, a beta-ketoimine, an ethylenediamine tetraacetic acid and derivatives thereof, a catechol, a choline-containing compound, a trifluoroacetic anhydride, an oxime, a dithiocarbamate, and combinations thereof.

The method may further comprise providing a sealable opening in the pressure vessel adapted to insert and withdraw one or more articles, inserting one or more contaminated articles into the pressure vessel prior to (b), cleaning the one or more contaminated articles during (c) and (d), depressurizing the pressure vessel by withdrawing a contaminated fluid therefrom, and withdrawing one or more cleaned articles therefrom. The fluid may comprise at least one component which undergoes a chemical reaction that is promoted by the ultrasonic energy introduced into the pressure vessel. The shoulder support section of the ultrasonic probe typically is located at a vibrational node between the first and second ends of the ultrasonic probe.

Another embodiment of the invention includes method for cleaning a contaminated wafer comprising:

(a) providing an ultrasonic pressure vessel system including
  (1) an ultrasonic probe assembly including
    (1a) an elongate planar body having a first end, a second end opposite the first end, a third end intersecting the first and second ends, a fourth end opposite the third end and intersecting the first and second ends, a first side intersecting the first, second, third, and fourth ends, and a second side opposite the first side and intersecting the first, second, third, and fourth ends;
    (1b) attachment means on the first end adapted for attaching the first end to one or more transducer assemblies;
    (1c) a first longitudinal shoulder support section projecting from the first side, extending linearly between the third and fourth ends, and having an outer edge; and
    (1d) a second longitudinal shoulder support section projecting from the second side, extending linearly between the third and fourth ends, and having an outer edge, wherein the second longitudinal shoulder support section is disposed opposite the first longitudinal shoulder support section;

wherein the distance between the outer edge of the first longitudinal shoulder support section and the outer edge of the second longitudinal shoulder support section is greater than the thickness of the planar body at any location between the longitudinal shoulder supports and the first end, the thickness of the planar body being defined as the perpendicular distance between the first and second sides;

(2) a reactor vessel having an interior, an exterior, and at least first and second openings between the interior and the exterior; and (3) first sealing means associated with the first and second longitudinal shoulder support sections and second sealing means associated with the first opening in the pressure vessel, wherein the first and second sealing means are adapted to form a seal between the ultrasonic probe and the pressure vessel, wherein the second end of the ultrasonic probe is disposed in the interior of the pressure vessel;

(b) introducing the contaminated wafer into the interior of the pressure vessel;

(c) introducing a pressurized fluid via the second opening into the interior of the pressure vessel, thereby pressurizing the vessel;

(d) providing electrical power to the ultrasonic transducer to generate ultrasonic energy; and (e) transmitting the ultrasonic energy through the ultrasonic probe to the pressurized fluid in the interior of the pressure vessel while moving the wafer past the second end of the ultrasonic probe.

The wafer may define a first plane and the ultrasonic probe may define a second plane, and the included angle between the first plane and the second plane may be between 10 degrees and 90 degrees.

BRIEF DESCRIPTION OF SEVERAL VIEWS OF THE DRAWINGS

Embodiments of the present invention are illustrated by the following drawings, which are not necessarily to scale.

DETAILED DESCRIPTION OF THE INVENTION

The design of an ultrasonic probe for use in transmitting ultrasonic energy from an external transducer into a process fluid in a pressurized vessel must meet several important criteria. First, an appropriate seal assembly is required to seal the probe at the vessel wall to prevent leakage of the pressurized fluid from the vessel interior. Second, because the probe is vibrating at very high frequencies, it must be mounted in the seal assembly such that the high-frequency vibrations do not destroy the seal where the probe passes through the vessel wall. Third, the seal assembly design must ensure that the probe is held in place and is not subject to blowout because of a large pressure differential between the pressurized vessel interior and the surrounding atmosphere. In addition, the probe and seal assembly must be readily removable for seal maintenance and replacement of components when required. The various embodiments of the present invention address these design criteria as described below.

Figure 1:
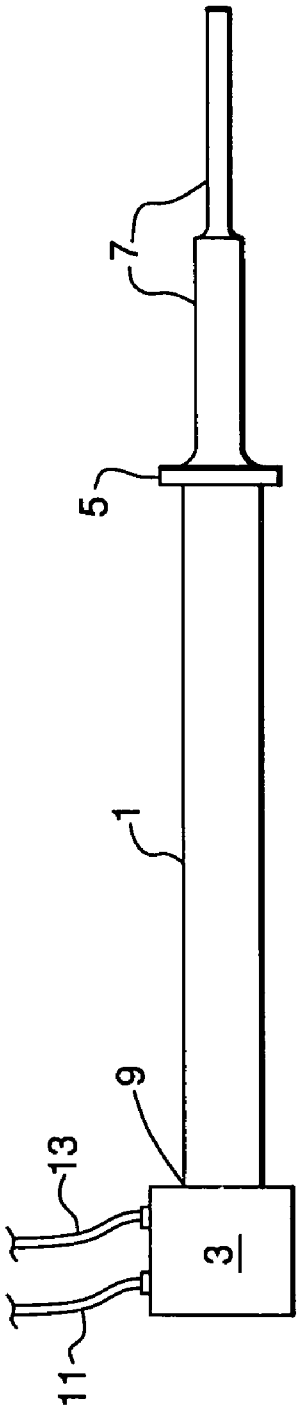
FIG. 1 is a side view of a cylindrical ultrasonic probe according to an embodiment of the invention.

A first embodiment of an ultrasonic probe is shown in FIG. 1. The probe is an elongate body comprising four main parts: main probe body 1, ultrasonic transducer 3, enlarged support section or collar support section 5, and horn 7. All parts of the probe may be cylindrical or alternatively any portion of the probe may have a non-circular cross section. When any part of the probe has a non-circular cross section, the non-circular part may be characterized by an equivalent diameter defined as the diameter of a circular cross section having the same area as the non-circular cross section. The generic term "equivalent diameter" as used herein thus refers to the diameter of a circular cross section when the part is cylindrical and refers to the equivalent diameter when the part has a non-circular cross section, and therefore the term equivalent diameter includes both cylindrical and non-cylindrical parts. When the part is cylindrical, the terms diameter and equivalent diameter have the same meaning and are interchangeable.

Main probe body 1 is fitted at one end thereof (which is the first end of the probe) with ultrasonic transducer 3 in attached to the probe at junction or connection point 9. Ultrasonic transducer 3 may be joined or connected to the end of main probe body 1 at point 9 by any appropriate means to ensure proper ultrasonic contact. For example, the ultrasonic transducer may be bolted to the end of main probe body 1 by any type of bolt or bolt assembly (not shown) as is known in the art. The term ultrasonic contact is defined herein as any method of joining the transducer and probe body such that vibrational energy generated by the transducer is transmitted directly to the probe without significant energy loss or dissipation and without any significant change in the frequency and intensity of the ultrasonic vibrations. The term "without significant energy loss" as used here means that at least 75% of the sonic energy generated by the transducer is transferred to the end of main probe body 1 at point 9.

Horn 7 operates as a booster to increase the amplitude of the ultrasonic waves generated by transducer 3 and transmitted by main probe body 1. The amplitude increases as the waves travel into progressively narrower sections of horn 7, and this focuses the ultrasonic energy for increased power density. For a stepped horn design illustrated by FIG. 1, the gain in ultrasonic wave amplitude provided by the decrease in cross-sectional area is typically equal to 0.8 times the ratio of the larger cross-sectional area to the smaller cross-sectional area. The acoustic or ultrasonic power transmitted into the fluid by the tip of horn 7 is proportional to the vibrational amplitude of the horn tip, and thus the horn can focus a high acoustic power to a selected area or volume within a pressurized fluid.

The equivalent diameter of collar support section 5 is greater than the equivalent diameter of main probe body 1 for reasons described later. Horn 7 may be stepped as shown wherein the diameter of the horn decreases discontinuously between collar support section 5 and the second end of the probe. Alternatively, the diameter of the horn may decrease continuously between collar support section 5 and the second end of the probe. Other horn configurations may be used and typically the diameters of all sections of the horn are less than the diameter of main probe body 1.

Ultrasonic transducer 3, which is shown schematically, may be a piezoelectric crystal or crystal assembly activated by alternating current supplied via conductors 11 and 13. These crystals oscillate at ultrasonic frequencies in the range of 20 KHz to 2 MHz and are commercially available in many different configurations. Alternatively, ultrasonic transducer 3 may be a magnetostrictive transducer assembly comprising iron or nickel surrounded by an electromagnetic coil attached to conductors 11 and 13 wherein the alternating magnetic field induces ultrasonic vibrations in the transducer.

Figure 2:
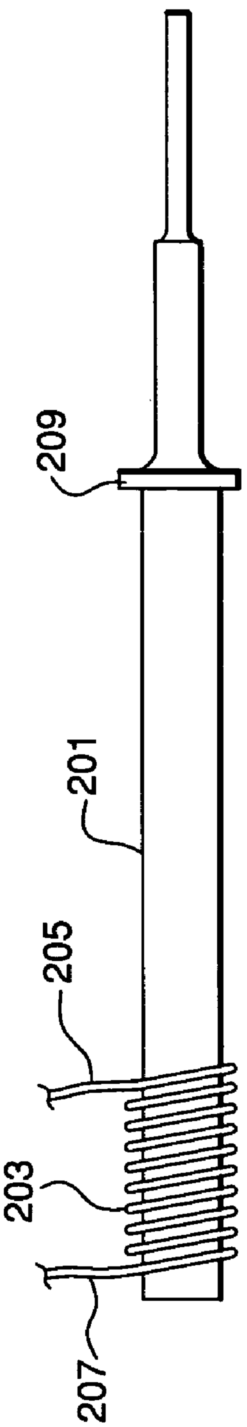
FIG. 2 is a side view of another cylindrical ultrasonic probe according to an alternative embodiment of the invention.

An alternative embodiment of the probe is shown in FIG. 2 wherein the core of a magnetostrictive transducer is an integral part of main probe body 1. As shown, a section of the main probe body adjacent to the first end is surrounded by electrically insulated electromagnetic coil 203 that is energized by alternating current supplied via conductors 205 and 207. The end of the main probe body within coil 203 may be the same metal as that of the rest of the probe or may be a different metal or alloy joined or attached to the probe by any appropriate method. As in the probe of FIG. 1, the diameter of enlarged support section or collar 209 is greater than the diameter of main probe body 201 for reasons described later.

Figure 3:
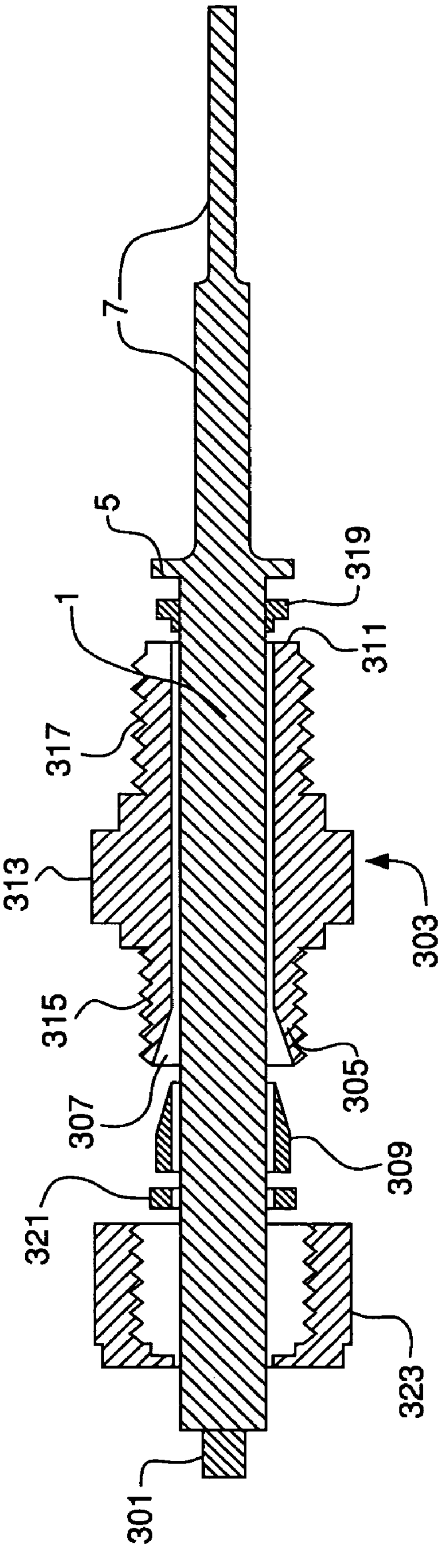
FIG. 3 is a sectional view of a cylindrical ultrasonic probe and seal assembly.

The ultrasonic probes described above are designed to fit into a seal assembly for mounting the probe in the wall of a pressure vessel. An axial section of an exemplary seal assembly and probe is illustrated in FIG. 3. The ultrasonic probe of FIG. 1 (without the ultrasonic transducer) is shown in FIG. 3 and includes main probe body 1, collar support section 5, and horn 7. In this illustration, the probe parts are all cylindrical but as mentioned earlier any part may have a non-circular cross section. The end of probe body 1 has threaded stud 301 for attachment of an ultrasonic transducer. The seal assembly comprises seal body 303, first end 305 with a tapered throat 307 to receive ferrule 309, second end 311 having a generally flat face, and a cylindrical bore between the first and second ends. Main probe body 1 of the probe is inserted coaxially into the cylindrical bore of the seal assembly wherein the inner diameter of the bore is greater than the outside diameter of the main probe body. Seal body 303 has center section 313 and may have at least two opposite parallel flat sections to fit a wrench; center section 313 may have a hexagonal outer cross section. Seal body 303 also has threaded sections 315 and 317 on either side of center section 313.

Threaded section 317 is designed to be sealably inserted into a threaded opening in the wall of a pressure vessel (not shown). Alternatively, instead of using threaded section 317, the seal body may be flanged at second end 311 and the flange designed to seal to a corresponding flanged opening in the wall of the pressure vessel. In another alternative, end 311 of seal body 303 may be welded directly to the opening in the pressure vessel. The outer diameters of seal ring 319 and collar support section 5 typically are smaller than the inner diameter of the threaded or flanged opening in the wall of the pressure vessel so that the probe can pass through the opening in the pressure vessel during installation.

Seal ring 319 is disposed between threaded section 317 and collar support section 5. This torroidal seal ring may have a thin front section which fits into the annulus between the outer surface of probe body 1 and the inner surface of the bore in seal body 303. The seal ring may have a thicker rear section which fits between second end 311 and an inner surface of collar support section 5. The dimensions of collar support section 5 should be designed appropriately for the anticipated differential operating pressure across the seal (i.e., the pressure difference between the interior of the pressure vessel and atmospheric pressure) formed by seal ring 319, collar support section 5, and the face of second end 311 of seal body 303. The radial height of collar support section 5, which is the distance that the collar support projects outward radially from, should be sufficient to avoid failure of the collar support section by compression. The axial thickness of collar support section 5 should be sufficient to avoid collar failure due to the axial shear caused by the pressure differential. The ratio of the distance between the end of probe body 1 and collar support section 5 to the distance from collar support section 5 to the end of horn 7 may be between 1:10 and 10:1

Ferrule 309 forms a packing gland in combination with follower ring 321 and threaded compression nut 323. Seal body 303, tapered throat 307, ferrule 309, follower ring 321, threaded compression nut 323, seal ring 319, second end 311, and collar support section 5 work in combination to locate main probe body 1 firmly and coaxially within the bore of seal body 303 such that the outer surface of main probe body 1 does not contact the inner surface of the bore in seal body 303. In addition, second end 311, seal ring 319, and collar support section 5 work in combination to seal main probe body 1 to seal body 303. These elements provide the sealing and centering functions for main probe body 1 by forcing collar support 5 axially against seal ring 319 and forcing seal ring 319 against second end 311, while simultaneously tightening compression nut 323 on threads 315 to push follower ring 321 against ferrule 309 and push ferrule 309 into tapered throat 307. The seal assembly then may be sealably threaded into a threaded opening in the wall of a pressure vessel. Alternatively, if seal body 303 is flanged at second end 311 instead of using threaded section 317, the flange is sealed to a corresponding flanged opening in the wall of the pressure vessel.

When the probe assembly is sealed into the pressure vessel and the vessel is pressurized with a high pressure fluid, the pressure differential between the vessel interior and the surrounding atmosphere forces collar support 5 axially against seal ring 319 and forces seal ring 319 against second end 311, thereby forming a pressure-activated seal. Thus increasing the pressure in the vessel will increase the force of collar support 5 axially against seal ring 319 and the force of seal ring 319 against second end 311.

The probe may be ultrasonically vibrated by means of an ultrasonic transducer attached to threaded stud 301 as described later. Ferrule 309 and seal ring 319 preferably are elastomeric materials which serve to isolate the vibrating probe body 1 from the fixed seal body 303. In addition, as described above, seal ring 319 seals probe body 1 to seal body 303 at end 311. Ferrule 309 and seal ring 319 may comprise any elastomeric material and may be selected from the group consisting of tetrafluoroethylene, chlorotrifluoroethylene, polyvinylidene fluoride, perfluoroalkoxy, polyethylene, unplasticized polyvinyl chloride, acrylonitrile butadiene styrene, acetal, cellulose acetate butyrate, nylon, polypropylene, polycarbonate, polyphenylene oxide, polyphenylene sulfide, polysulfone, polyamide, polyimide, thermosetting plastic, natural rubber, hard rubber, chloroprene, neoprene, styrene rubber, nitrile rubber, butyl rubber, silicone rubber, chlorosulfonated polyethylene, polychlorotrifluoroethylene, polyvinyl chloride elastomer, cis-polybutadiene, cis-polyisoprene, ethylene-propylene rubber, carbon, and graphite.

The various elements of the probe and seal assembly of FIG. 3, other than ferrule 309 and seal ring 319, may be fabricated from a metal or metals appropriate for the required service. Such metals may include, for example, titanium, carbon steel, iron, copper, brass, bronze, nickel, and alloys thereof. The metals also may include aluminum, aluminum alloys, stainless steel alloys, and other commercially-available alloys such as Hastelloy®, Inconel®, and Monel®.

The end of horn 7 may have a detachable tip of any shape. In one embodiment, the detachable tip may have the same diameter as the end of horn 7. In other embodiments, the detachable tip may have other geometries that are designed to direct or radiate ultrasonic energy in a particular manner for a given application.

Main probe body 1 and horn 7 vibrate or oscillate as ultrasonic waves pass from an ultrasonic generator attached to threaded stud 301 to the tip of horn 7. The amplitude of the axially-directed oscillations varies along the length of the main probe body and horn and is a function of the probe and horn geometry. The amplitude reaches maxima at the vibrational antinodes and reaches minima at the vibrational nodes. The seal assembly of FIG. 3 will constrain the vibrational motion of main probe body 1 while simultaneously providing pressure seals at ferrule 309 and seal ring 319. If the sealing points of this assembly were rigid connections, there could be a resulting vibrational energy loss at these points, which could lead to localized overheating, mechanical damage, and eventual fluid leakage. In addition, if the probe body were constrained too rigidly at the seals, the combined probe body and horn could become acoustically detuned, and this in turn could reduce the efficiency of the transducer/probe assembly and cause to damage to the assembly.

The probe and seal assembly of FIG. 3 should be designed such that the seals at ferrule 309 and seal ring 319 are located at vibrational nodes of the probe. The combination of this design feature, the use of elastomeric materials for ferrule 309 and seal ring 319, and the function of ferrule 309 and seal ring 319 to prevent metal-to-metal contact between main probe body 1 and seal body 303, should minimize or eliminate these problems. The dimensions between the ultrasonic transducer, end 305 of seal body 303, and end 311 of seal body 303 should be selected carefully in combination with the operating parameters of the ultrasonic transducer to ensure that the vibrational nodes of the assembly occur at the seals formed by ferrule 309 and seal ring 319.

Figure 4:
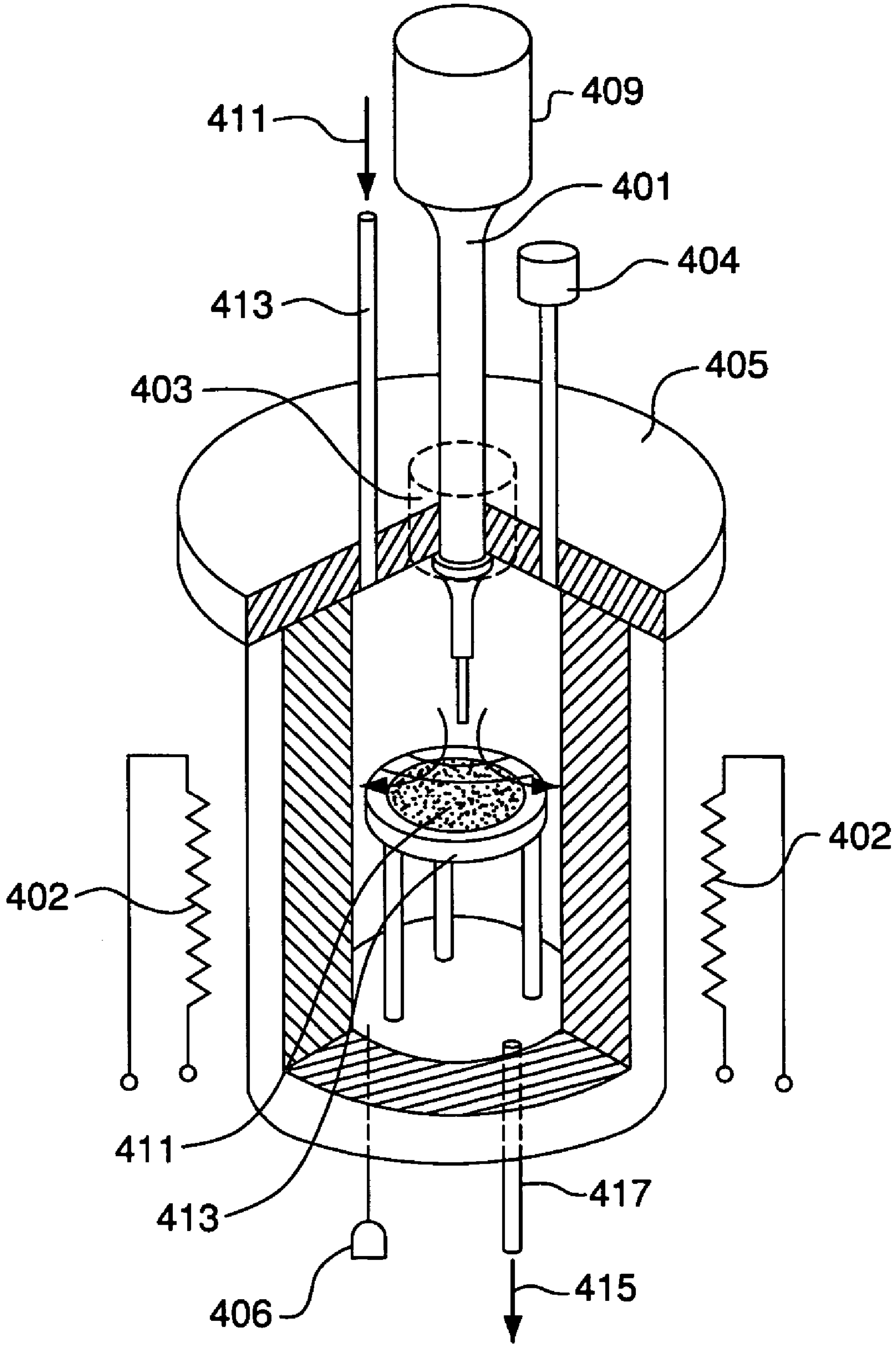
FIG. 4 is an illustration of a cylindrical ultrasonic probe and seal assembly in a pressurized vessel for the ultrasonic cleaning of articles.

The probe and seal assembly of FIGS. 1 and 3 may be installed in a pressure vessel as illustrated in FIG. 4. In this schematic illustration, probe 401 is inserted through seal body 403 attached to top 405 of pressure vessel body 407. Seal body 403 is shown here in phantom and represents the seal body 303 of FIG. 3. Ultrasonic transducer 409 is attached to the end of probe 401. Heaters 402 may be used to maintain the vessel at an elevated temperature. Pressure sensor 404 and temperature sensor 406 enable the monitoring of the pressure and temperature in the vessel. Fresh cleaning fluid 411, for example a supercritical fluid, flows into the vessel via inlet line 413. Contaminated cleaning fluid 415 exits the vessel via line 415. In this illustration, the system comprising the probe, transducer, seal body, and pressure vessel is used for the cleaning of article 411 located on support 413. This article may be, for example, a semiconductor device or component previously subjected to manufacturing steps such as lithography, etching, stripping, and chemical mechanical planarization.

The pressure vessel of FIG. 4 may be utilized, for example, as a test system for studying methods of cleaning a single article or a small number of articles. In a typical test, the pressure vessel components are disassembled, article 411 to be cleaned is placed on holder 411, top 405 (with seal body 403 and probe 401 having been installed previously) is sealed to pressure vessel body 407, a pressurized cleaning fluid is introduced into the sealed vessel, and the ultrasonic transducer is operated at a selected frequency and power level to generate ultrasonic waves 415 in the pressurized fluid. Upon completion of the cleaning step, the system is depressurized, the vessel is opened, and the cleaned article is withdrawn. The pressure vessel of FIG. 4 alternatively may be used for supercritical fluid extraction or as a sonochemical chemical reactor, wherein the extraction and chemical reactions are enhanced by the ultrasonic energy.

Larger and more complex pressure vessel systems may be required for commercial ultrasonic cleaning applications. An example of an advanced ultrasonic cleaning system using the ultrasonic probe and seal assembly systems, described above is illustrated in FIG. 5, which is an exemplary system designed for the cleaning of large-diameter flat articles such as silicon wafers using a flow of pressurized cleaning fluid. Pressure vessel 501 comprises vessel lid 503, cylindrical wall 505, and detachable vessel bottom 507. Wafer 509, for example a 300 mm diameter wafer, is placed on a rotating table (not visible in this view) driven by shaft 513 via a magnetic coupling (not visible) installed on detachable vessel bottom 507.

Multiple probe and seal assemblies are mounted in vessel lid 503. In this illustration, four assemblies are installed in a radial configuration to expose the rotating wafer to uniform ultrasonic energy waves 514. The four assemblies include ultrasonic transducers 515, 517, 519, and 521 and probes 523, 525, 527, and 529, wherein each probe includes main probe body 1, collar support section 5, and horn 7 as illustrated in FIG. 3. Alternatively, a single ultrasonic transducer attached to probes 523, 525, 527, and 529 may be used instead of individual transducers 515, 517, 519, and 521. Seal assemblies 531, 533, 535, and 537 (shown here in phantom) are installed in vessel lid 503 and each comprise tapered throat 307, ferrule 309, follower ring 321, threaded compression nut 323, seal ring 319 as illustrated in FIG. 3.

Pressurized fluid for the cleaning process is introduced through inlet line 539 at the center of vessel lid 503, flows radially through the interior of the vessel, under circular baffle 541, and exits via multiple outlet lines 543 located around the outer edge of the vessel. The pressurized fluid alternatively may be introduced via a shower head, multiple inlet tubes, or other inlet devices known in the art. The flow of cleaning fluid continuously sweeps contaminants, reactants, and undesirable contaminants from the surface of the wafer and out through the multiple outlets. The internal volume of vessel 501 should be minimized to minimize processing time and materials requirements.

In order to expose the surface of wafer 509 to a uniform level of ultrasonic energy, the power settings of the transducers may be maintained at different levels at the different radial locations such that transducer 515 has the highest setting and transducer 521 has the lowest setting. The tangential velocity of the wafer is lower near the center and higher near the periphery, and the power settings for transducers 515, 517, 519, and 521 may be selected to provide a relatively uniform time-integrated exposure to ultrasonic energy across the entire wafer surface.

Figure 5:
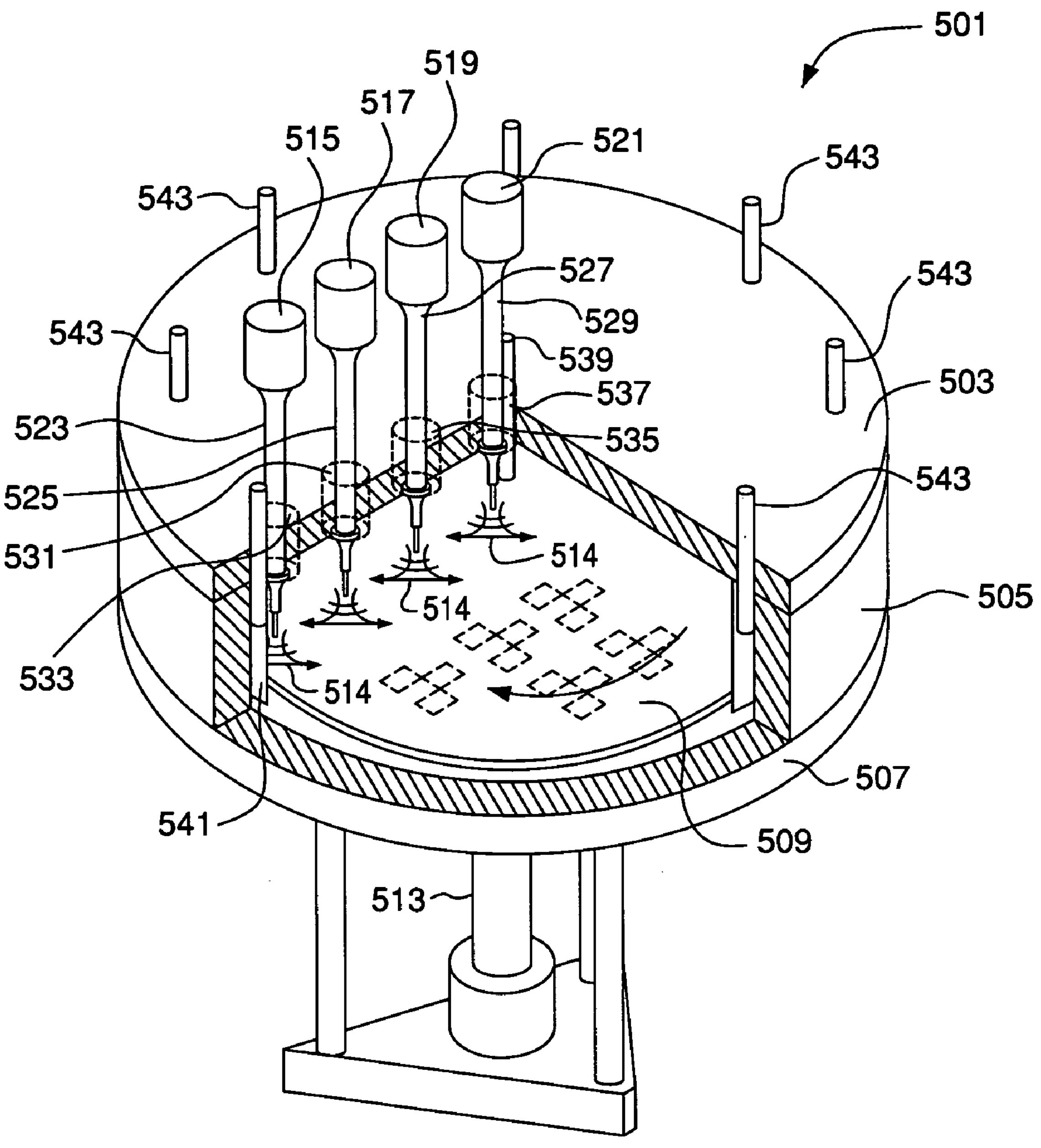
FIG. 5 is an illustration of multiple cylindrical ultrasonic probe and seal assemblies in a pressurized vessel for the ultrasonic cleaning of articles.
Figure 6:
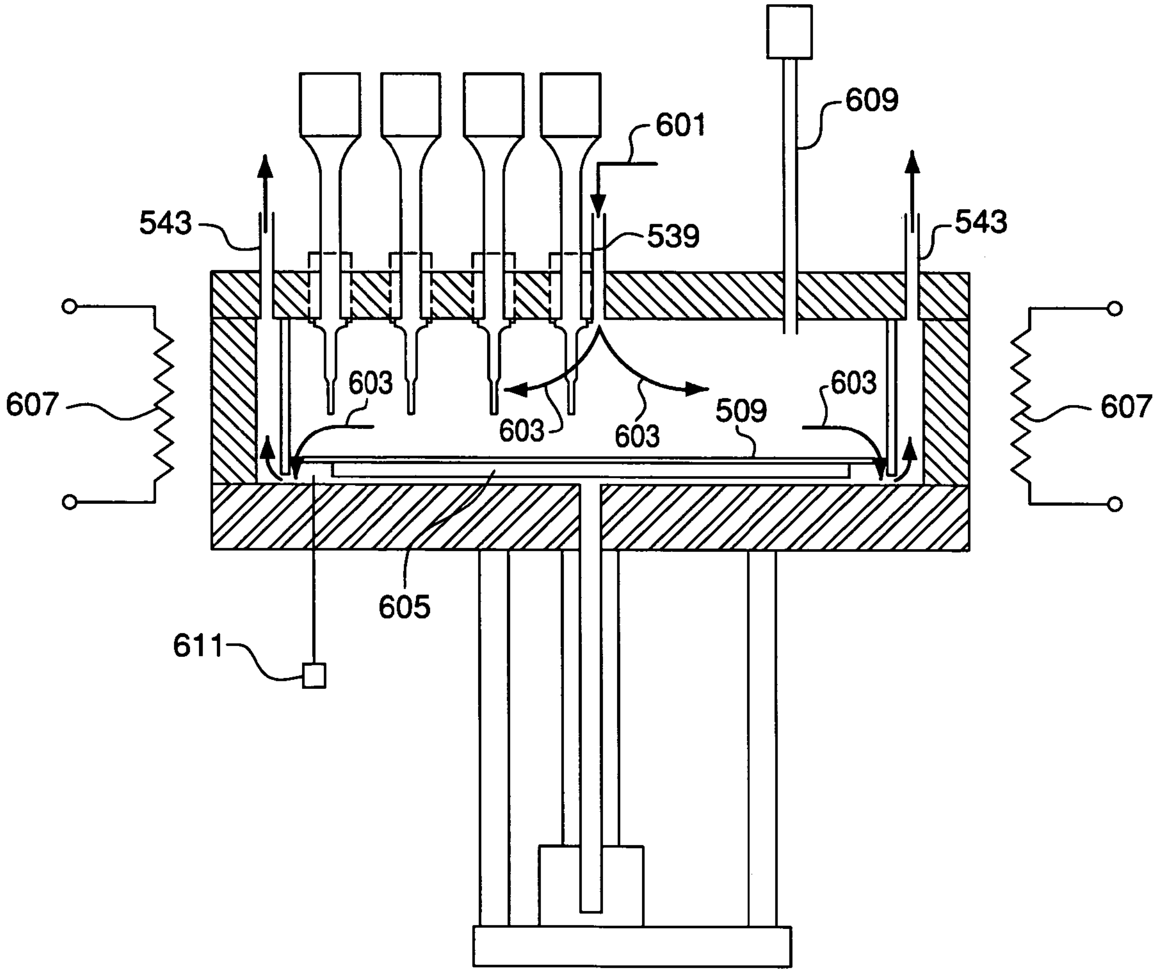
FIG. 6 is a side sectional view of the system of FIG. 5.

A schematic sectional side view of the system of FIG. 5 is shown in FIG. 6. Pressurized fluid 601 enters inlet 539, fluid 603 flows uniformly over the surface of wafer 509, under baffle 541, and exits via outlets 543. The wafer requires at least one full rotation in order to complete the cleaning process, and the cycle time thus is set by the rotation rate of rotating table 605. Heaters 607 may be used to maintain the system at an elevated temperature. The pressure and temperature in the vessel may be monitored by pressure probe 609 and temperature probe 611. Additional transducer/probe assemblies may be installed to reduce processing time in this type of system. For example, two additional radial rows of four assemblies may be installed for a total of three radial rows located 120 degrees apart. In this alternative, wafer processing time would be reduced by 67%. In another alternative, the multiple transducers in a row of radial transducer/probe assemblies may be replaced by a single linear transducer driving all four probes.

An alternative probe geometry may be used in which the probe is planar rather than cylindrical as described in FIGS. 1-3. This alternative probe geometry is shown in the sectional illustration of FIG. 7. Planar probe 701 comprises an elongate planar body having first end 703, second end 705, first longitudinal shoulder support 707, and oppositely-located and parallel second longitudinal shoulder support 709. Threaded stud 704 may be used to attach an ultrasonic transducer to first end 703 of planar probe 701. Horn 711 is formed between second end 705 and the two shoulder supports 707 and 709. Main probe body 713 is formed between first end 705 and the two shoulder supports 707 and 709. Probe 701 has a first side comprising planar surface portion 715 of horn 711 and planar surface portion 717 of main probe body 713. Probe 701 has a second side comprising opposite second planar surfaces (not seen in this drawing) that are parallel to planar surface portion 715 of horn 711 and planar surface portion 717 of main probe body 713, respectively.

Planar probe 701 may be installed in pressure vessel wall 719 by means of two parallel seal assemblies 721 and 723, which are sealed or welded to pressure vessel wall 719 at parallel joints 725 and 727 formed between the seal assembly and the vessel wall. Seal assemblies 721 and 723 are mirror images of each other, and the following description of the elements of seal assembly 721 therefore applies to the corresponding elements of seal assembly 723. Seal assembly 721 comprises seal body 729, seal cap 731, seal bolt 732, seal bolt washer 733, seal nut 735, follower 737, elastomeric packing gland 739, and elastomeric shoulder seal 741.

Seal body 729, seal cap 731, seal bolt 732, seal bolt washer 733, seal nut 735, follower 737, packing gland 739, shoulder support 709, and shoulder seal 741 work in combination to locate main probe body 713 firmly between seal assemblies 721 and 723. The outer surface of main probe body 713 does not contact the inner surfaces of seal cap 731, follower 737, and seal body 729. Likewise, the opposite parallel surface (not visible) of main probe body 713 does not contact the corresponding seal cap, follower, and seal body of seal assembly 723. A gap is formed between the outer side of main probe body 713 and the inner surfaces of seal cap 731, follower 737, and seal body 729. Likewise, a similar gap is formed on the opposite side of main probe body 713. Shoulder seal 741 has a thin upper section which fits into the gap between the lower portion of seal body 729 and planar surface portion 717 of main probe body 713. The shoulder seal has a thicker lower section which fits between shoulder support 709 and the bottom of seal body 729.

The functions of these elements for sealing and locating planar probe 701 are provided by forcing shoulder support 709 against shoulder seal 741, thereby forcing shoulder seal 741 against the bottom of seal body 729 and into the gap between seal body 729 and planar surface portion 717 of main probe body 713. Seal bolt 732 and seal nut 735 are tightened to compress packing gland 739 between follower 737 and the lower part of seal body 729, thereby forcing packing gland 739 against and planar surface portion 717 of main probe body 713. The same procedure is used for the corresponding elements in seal assembly 723 on the opposite side of planar probe 701. Shoulder support 709 and shoulder seal 741 ensure that planar probe 701 cannot slip out of seal assembly 721 when high pressures occur on the interior of pressure vessel wall 719.

The probe may be ultrasonically vibrated by means of one or more ultrasonic transducers (not shown) attached to first end 703. Main probe body 713 and horn 711 vibrate or oscillate as ultrasonic waves pass from the ultrasonic generator to second end 705 of planar probe 701. The amplitude of the axially-directed oscillations varies along the length of the main probe body and horn, and the amplitude is a function of the probe and horn geometry. The amplitude reaches maxima at the vibrational antinodes and reaches minima at the vibrational nodes. The seal assemblies 721 and 723 of FIG. 7 will constrain the vibrational motion of main probe body 701 while simultaneously providing pressure seals at shoulder seal 741 and packing gland 739. If the sealing points of this assembly were rigid connections, there could be a resulting energy loss at these points, which could lead to localized overheating, mechanical damage, and eventual fluid leakage. In addition, if the probe body were constrained too rigidly at the seals, the combined probe body and horn could become acoustically detuned, and this in turn could reduce the efficiency of the transducer/probe assembly and cause to damage to the assembly.

The second end 705 of horn 711 may have a detachable tip of any shape. In one embodiment, the detachable tip may have the same shape as the end of horn 711. In other embodiments, the detachable tip may have other geometries that are designed to direct or radiate ultrasonic energy in a particular manner for a given application.

The elastomeric materials of packing gland 739 and shoulder seal 741 serve to isolate the vibrating planar probe 701 from seal body 703 and follower 737. In addition, as described above, packing gland 739 and shoulder seal 741 seal planar probe 701 to seal body 729, thereby sealing the interior of the vessel from the external atmosphere. Packing gland 739 and shoulder seal 741 may comprise any elastomeric material and may be selected from the group consisting of tetrafluoroethylene, chlorotrifluoroethylene, polyvinylidene fluoride, perfluoroalkoxy, polyethylene, unplasticized polyvinyl chloride, acrylonitrile butadiene styrene, acetal, cellulose acetate butyrate, nylon, polypropylene, polycarbonate, polyphenylene oxide, polyphenylene sulfide, polysulfone, polyamide, polyimide, thermosetting plastic, natural rubber, hard rubber, chloroprene, neoprene, styrene rubber, nitrile rubber, butyl rubber, silicone rubber, chlorosulfonated polyethylene, polychlorotrifluoroethylene, polyvinyl chloride elastomer, cis-polybutadiene, cis-polyisoprene, ethylene-propylene rubber, carbon, and graphite.

Figure 7:
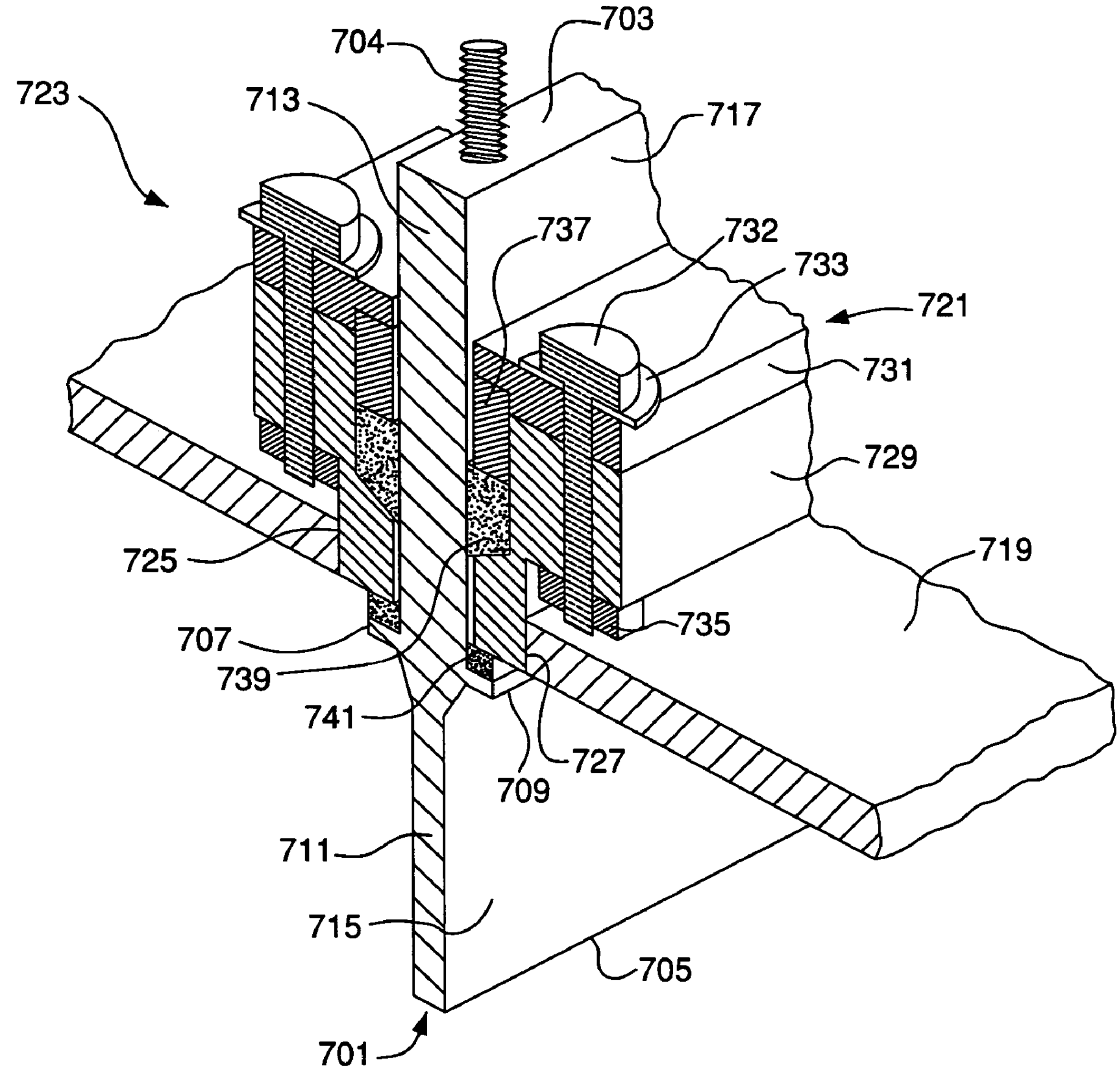
FIG. 7 is a sectional end view of a planar ultrasonic probe and seal assembly installed in the wall of a pressure vessel.

The various elements of the probe and seal assembly of FIG. 7, other than packing gland 739 and shoulder seal 741, may be fabricated from a metal or metals appropriate for the required service. Such metals may include, for example, titanium, carbon steel, iron, copper, brass, bronze, nickel, and alloys thereof. The metals also may include aluminum, aluminum alloys, stainless steel alloys, and other commercially-available alloys such as Hastelloy®, Inconel®, and Monel®.

The probe and seal assembly of FIG. 7 should be designed such that the seals at packing gland 739 and shoulder seal 741 are located at vibrational nodes of the probe. The combination of this design feature, the use of elastomeric materials for packing gland 739 and shoulder seal 741, and the function of packing gland 739 and shoulder seal 741 to prevent metal-to-metal contact between main probe body 701 and seal body 729, should minimize or eliminate these problems. The dimensions between the ultrasonic transducer, packing gland 739, and shoulder seal 741 should be selected carefully in combination with the operating parameters of the ultrasonic transducer to ensure that the vibrational nodes of the assembly occur at the seals formed by packing gland 739 and shoulder seal 741.

The dimensions of planar probe 701 should be designed appropriately for the anticipated differential operating pressure across the seal (i.e., the pressure difference between the interior of pressure vessel 719 and atmospheric pressure) formed by shoulder seal 741, seal body 729, and shoulder support 709. The thickness of shoulder support 709, which is the distance that the shoulder support projects outward perpendicularly from planar probe 701, should be sufficient to avoid failure of the collar support section by compression. The axial thickness of shoulder support 709 should be sufficient to avoid collar failure due to shear parallel to the plane of planar probe 701 caused by the pressure differential.

An example of an advanced ultrasonic cleaning system using the ultrasonic probe and seal assembly systems described above is illustrated in FIG. 8, which is an exemplary system designed for the cleaning of large-diameter flat articles such as silicon wafers using a flow of pressurized cleaning fluid. Pressure vessel 801 comprises vessel lid 803, cylindrical wall 805, and vessel bottom 807. Wafer 809, for example a 300 mm diameter wafer, is placed on a rotating table (not visible in this view) driven by shaft 813 via a magnetic coupling (not visible) installed on vessel bottom 807.

A probe and seal assemblies similar to those of FIG. 7 are mounted in vessel lid 803. In this illustration, planar probe 815 is mounted in seal device 817, which is shown here in phantom and includes all of the seal elements described with reference to FIG. 7, and the probe is driven by single transducer 819. The planar probe of this embodiment may provide a more uniform radial distribution of ultrasonic waves across the surface of wafer 809 as compared with the multiple probe system of FIGS. 5 and 6 described above.

Pressurized fluid for the cleaning process may be introduced through inlet line 821 at the center of vessel lid 803, flows radially through the interior of the vessel, under circular baffle 823, and exits via multiple outlet lines 825 located around the outer edge of the vessel. The pressurized fluid alternatively may be introduced via a shower head, multiple inlet tubes, or other inlet devices known in the art. The flow of cleaning fluid continuously sweeps contaminants, reactants, and undesirable contaminants from the surface of the wafer and out through the multiple outlets. The internal volume of vessel 801 should be minimized to minimize processing time and materials requirements. The pressure and temperature in the vessel may be monitored by pressure and temperature probes 826 and 828, respectively.

Figure 8:
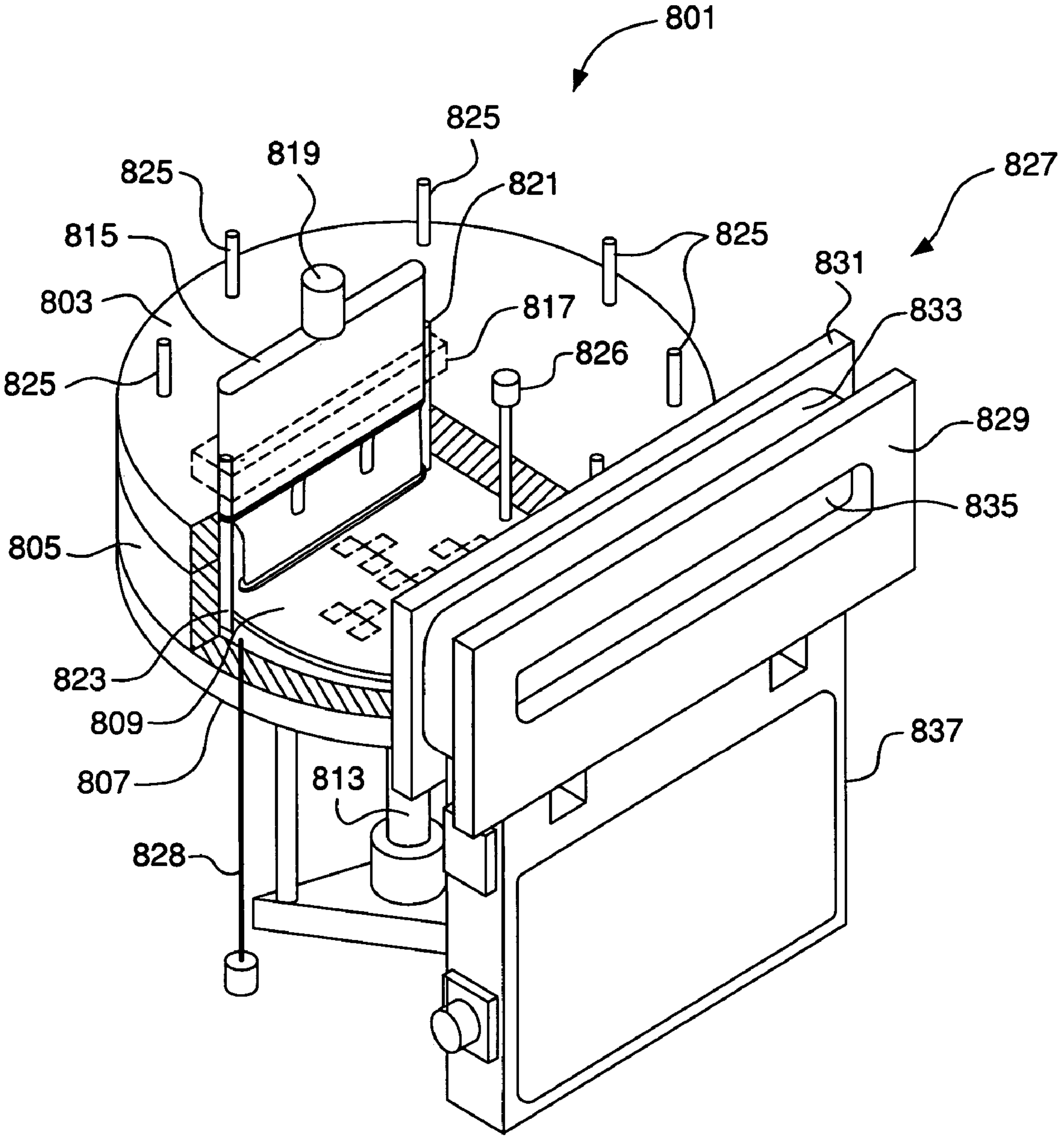
FIG. 8 is a partial sectional view of a system including a planar ultrasonic probe, seal assembly, and pressure vessel for cleaning wafers or other articles with a gate-type door assembly for inserting and withdrawing the wafers or other articles.

FIG. 8 also shows an exemplary apparatus for loading and unloading a wafer from pressure vessel 801. Gate valve or door assembly 827 comprises front gate guide 829, rear gate guide 831, gate seal assembly 833, gate opening 835, and gate drive assembly 837. Gate opening 835 is in flow communication with and is sealed to pressure vessel 801, and opens into the interior of the vessel. A valve gate (not seen in this view) is moved upward by gate drive assembly 837 through gate seal assembly 833 to seal a wafer into the pressure vessel and the gate is moved downward to open the vessel for insertion and removal of the wafer. A wafer may be inserted and withdrawn through the gate valve assembly by manual means or by robotic wafer handlers as known in the silicon wafer processing art. Thus the seals provided by gate seal assembly 833 (when the gate is closed) and by seal device 817 allow leak-free pressurization of the interior of pressure vessel 801 during the cleaning process.

Figure 9:
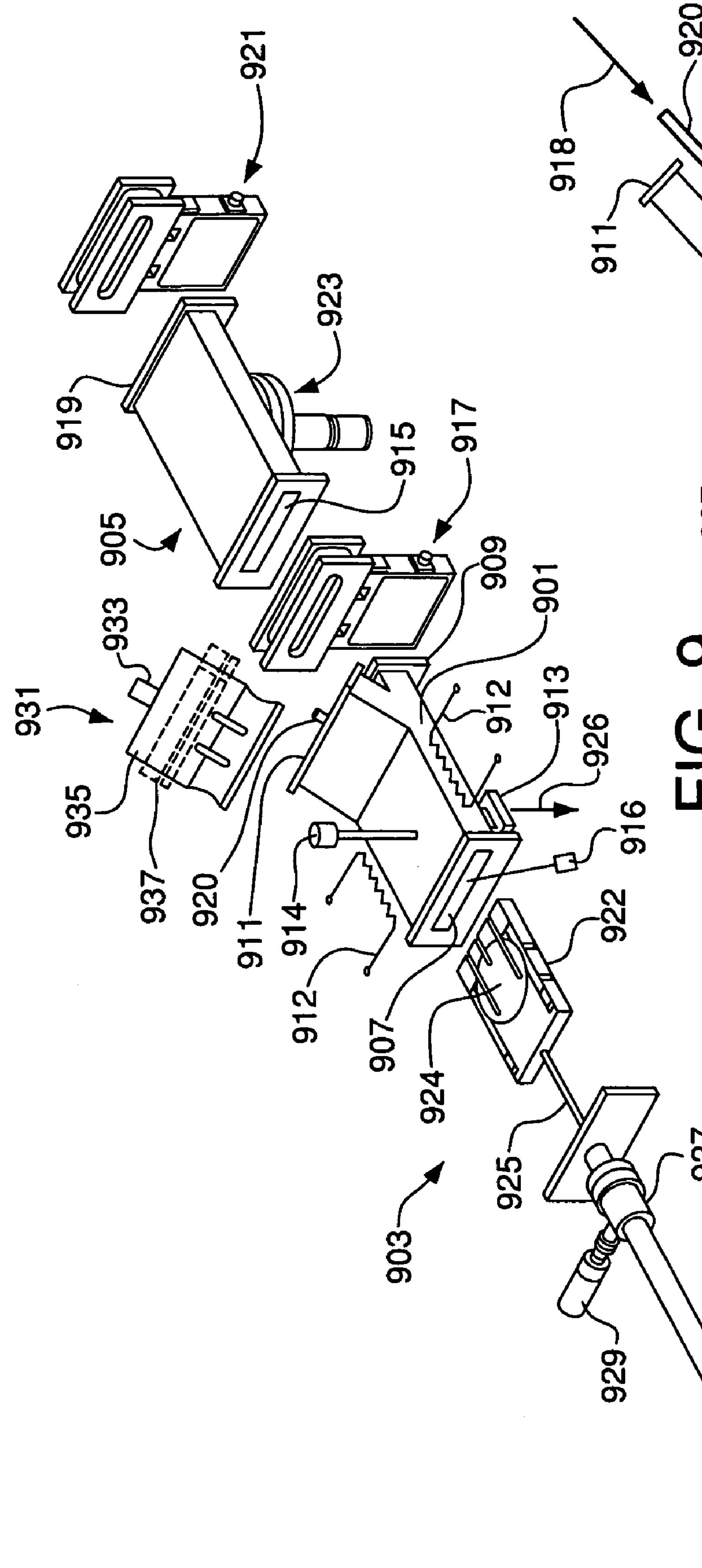
FIG. 9 is an exploded view of an alternative system including a planar ultrasonic probe, seal assembly, and pressure vessel for cleaning wafers or other articles with a gate-type door assembly for inserting and withdrawing the wafers or other articles.

An alternative wafer cleaning system which uses the probe and seal assembly of FIG. 7 is illustrated in an exploded view in FIG. 9. This exemplary system utilizes linear motion of the wafer during cleaning, in contrast with the rotational motion in the systems of FIGS. 5, 6, and 8. The system comprises reactor 901, wafer carrier system 903, and optional loadlock chamber 905. Reactor 903 includes front loading opening and flange 907 that joins with wafer carrier seal plate 930 to form a pressure seal, a corresponding rear loading opening 909, ultrasonic probe opening 911, heaters 912, and cleaning fluid vent 913. Temperature and pressure may be monitored by temperature sensor 914 and pressure sensor 916. Fresh cleaning fluid may be introduced via inlet 920. Optional loadlock chamber 905 includes front loading opening 915, front gate valve or door assembly 917, rear opening 919, rear gate valve or door assembly 921, and wafer lifting pin 923.

Wafer carrier system 903 comprises wafer carrier 922 mounted on carrier rod 925 and wafer carrier 922 has a recessed surface 924 for holding a wafer. Carrier rod 925 is adapted to move wafer carrier forward or backward linearly along the axis of reactor 901 by rack and pinion linear actuator 927 and stepping motor 929 mounted on wafer carrier seal plate 930.

Figure 9A:
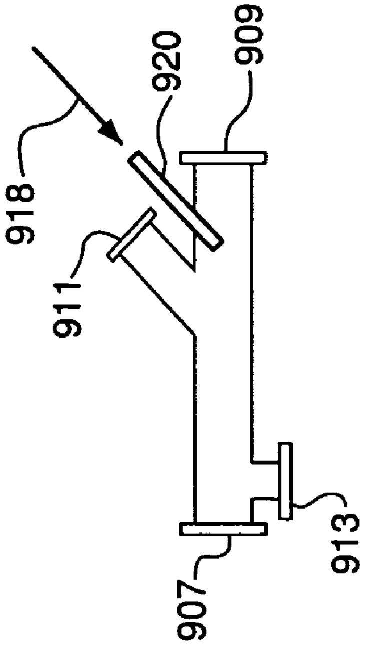

FIG. 9A, which is an inset of FIG. 9, shows a side view of reactor 901 including front loading opening 907, corresponding rear loading opening 909, ultrasonic probe opening 911, and cleaning fluid vent 913. Fresh cleaning fluid 918 enters via inlet line 920 and contaminated cleaning fluid 926 (FIG. 9) exits via fluid vent 913.

Ultrasonic probe assembly 931, which uses components similar to those of the planar ultrasonic probe assemblies in FIGS. 7 and 8, fits sealably into ultrasonic probe opening 911. The probe assembly comprises ultrasonic transducer 933, probe 935, and seal device 937 (shown in phantom). Seal device 937 includes all the seal components described with reference to FIG. 7. The plane of ultrasonic probe opening 911 may form an included angle of 10 degrees to 90 degrees with the plane of reactor 901, and a typical angle may be 45 degrees. As a wafer in recessed surface 924 moves with wafer carrier 922 through reactor 901 during a cleaning step, the included angle between the plane of ultrasonic probe 931 and the plane of the wafer may be between 10 degrees to 90 degrees.

In one method of operation, reactor 901, wafer carrier system 903, ultrasonic probe assembly 931, front gate valve or door assembly 917, rear gate valve or door assembly 921, and wafer lifting system 923 are joined and sealed together to provide a pressurizable reactor system. The six components 901, 903, 905, 917, 921 and 931 of this system are operated in a programmed sequence of twenty one steps. In step 1, the system is in its initial status: ultrasonic transducer 931 is off, pressurized cleaning fluid flow inlet 920 is closed, the pressure of the reactor chamber 901 is set at an initial low pressure, and wafer carrier 922 is retracted into isolated cleaning chamber 901. The wafer lifting pins 923 are down, the loadlock/wafer loader gate valve 921 is open, and there is no wafer in the loadlock 901.

At this point in the sequence a wafer loader robot (not shown) or operator (not shown) delivers a contaminated wafer (not shown) into the loadlock chamber 905 for cleaning. The wafer is placed onto the lowered lifting pins by the robot or operator, and the pins are then raised. In the next six steps of the operating sequence, the wafer loading is completed. The steps proceed as follows: (2) the loadlock/wafer loader gate valve 921 closes; (3) the pressure in the loadlock chamber 905 is equalized with that of the cleaning chamber 901 by opening a valve in a bypass line (not shown) around cleaning chamber/loadlock gate valve 917; (4) the pressurized flow inlet is opened, allowing pressurized cleaning fluid to enter the cleaning chamber 901, and the loadlock chamber pressurizes as cleaning fluid flows continuously through the cleaning chamber and passes to the chamber's outlet line; (5) cleaning chamber/loadlock gate valve 917 then opens; (6) carrier block 922 is then extended to a position under the wafer by actuating stepping motor 929; and (7) the wafer is lowered onto carrier block 922 using wafer lifting mechanism 923.

In step 8, stepping motor 929 is again actuated, but in the reverse direction, and carrier block 922 begins to move back into cleaning chamber 901 and carry the wafer into the cleaning chamber. In step 9, ultrasonic transducer 933 is activated and ultrasonic energy begins to pass into the cleaning fluid, exposing the wafer to the cleaning process. The stepping motor then reverses direction in step 10, exposing the wafer to the second pass under the ultrasonically-activated probe.

In the next five steps the wafer is returned to loadlock chamber 905. The steps proceed as follows: (11) the ultrasonic transducer is de-activated; (12) the pins lift the wafer off the carrier block 922; (13) carrier block 922 retracts into the cleaning chamber; and (14) cleaning chamber/loadlock chamber gate valve 917 is closed as (15) the pressurized cleaning fluid inlet is closed.

In the next four steps, the loadlock chamber is further de-pressurized and, if necessary, is evacuated. The steps proceed as follows: (16) the cleaning chamber and loadlock chamber pressure falls as the pressurized cleaning fluid exits the cleaning chamber, and this venting process produces a set low pressure in the cleaning chamber and loadlock chamber; then, (17) the valve in the bypass line (not shown) around cleaning chamber/loadlock gate valve 917 is closed. In some cases, the loadlock may be evacuated further in order to equilibrate the loadlock pressure with that of an attached robotic wafer loading system (not shown). If further loadlock evacuation is necessary, then (18) the vent valve in a vacuum line (not shown) extending from the loadlock chamber is opened to complete evacuation of the loadlock chamber. Following this evacuation of the loadlock chamber, (19) this vent line valve is closed, and the loadlock chamber is left in an evacuated condition.

In the final two steps of the operating sequence, the cleaned wafer is unloaded. In step 20 the wafer is lowered by lowering the lifting pins of wafer lifter 923. Finally, in step 21 loadlock/wafer loader gate valve 921 is opened and the wafer is removed by the loader robot or operator. At this point the system has returned to its initial (step 1) status.

The estimated time required to complete the steps is as follows: steps 1 to 7 (loading), approximately 10 seconds; steps 8, 9 and 10 (cleaning), approximately 48 seconds; steps 11 to 21 (unloading), approximately 20 seconds; total time required to complete the sequence, approximately 78 seconds. Steps 8, 9 and 10 may be accomplished in less time in an optimized cleaning process.

The ultrasonic cleaning systems described above may use a wide variety of pressurized cleaning fluids and optional processing agents mixed with the cleaning fluids. A cleaning fluid may be in the form of a pressurized condensing vapor, a pressurized saturated or subcooled liquid, a dense fluid, or a supercritical fluid. The pressurized cleaning fluid may comprise one or more components selected from the group consisting of carbon dioxide, nitrogen, methane, oxygen, ozone, argon, hydrogen, helium, ammonia, nitrous oxide, hydrogen fluoride, hydrogen chloride, sulfur trioxide, sulfur hexafluoride, nitrogen trifluoride, monofluoromethane, difluoromethane, tetrafluoromethane, trifluoromethane, trifluoroethane, tetrafluoroethane, pentafluoroethane, perfluoropropane, pentafluoropropane, hexafluoroethane, hexafluoropropylene, hexafluorobutadiene, octafluorocyclobutane, and tetrafluorochloroethane. The pressurized fluid may further comprise one or more processing agents selected from a group consisting of an acetylenic alcohol, an acetylenic diol, a dialkyl ester, hydrogen fluoride, hydrogen chloride, chlorine trifluoride, nitrogen trifluoride, hexafluoropropylene, hexafluorobutadiene, octafluorocyclobutane tetrafluorochloroethane, fluoroxytrifluoromethane ($CF_4O$), bis(difluoroxy)methane ($CF_4O_2$), cyanuric fluoride ($C_3F_3N_3$), oxalyl fluoride ($C_2F_2O_2$), nitrosyl fluoride (FNO), carbonyl fluoride ($CF_2O$), perfluoromethylamine ($CF_5N$), an ester, an ether, an alcohol, a nitrile, a hydrated nitrile, a glycol, a monester glycol, a ketone, a fluorinated ketone, a tertiary amine, an alkanolamine, an amide, a carbonate, a carboxylic acid, an alkane diol, an alkane, a peroxide, a water, an urea, a haloalkane, a haloalkene, a beta-diketone, a carboxylic acid, an oxine, a tertiary amine, a tertiary diamine, a tertiary triamine, a nitrile, a beta-ketoimine, an ethylenediamine tetraacetic acid and derivatives thereof, a catechol, a choline-containing compound, a trifluoroacetic anhydride, an oxime, a dithiocarbamate, and combinations thereof.

Typical operating parameters for the systems described above may include fluid pressures in the range of $10^{-3}$ to 680 atma, temperatures in the range of ambient to 95° C., ultrasonic energy frequencies in the range of 20 KHz to 2 MHz, and ultrasonic power densities in the range of 0.1 to 10,000 W/in$^2$. Articles being cleaned may be exposed to ultrasonic energy for 30 to 120 seconds. Frequency sweeping may be used in which the frequency is varied during the cleaning period according to a predetermined frequency profile.

The following Examples illustrate embodiments of the present invention but do not limit the invention to any of the specific details described therein.

EXAMPLE 1

A probe as described with reference to FIG. 3 was fabricated from titanium with the following dimensions: total length including main probe body 1, collar support section 5, and horn 7, 6.86 inch; combined length of probe body 1 and collar support section 5, 3.10 inch; total length of horn 7, 3.76 inch; length of larger diameter horn section, 1.76 inch; length of smaller diameter horn section, 2.00 inch; diameter of main probe body 1; 0.50 inch; diameter of smaller diameter horn section, 0.125 inch, and diameter of larger diameter horn section, 0.250 inch. The axial thickness of collar support section 5 is 0.125 inch and the diameter is 0.650 inch. The end of the horn adjacent collar support section 5 has a smooth radius transition from 0.500 inch diameter to 0.250 inch diameter and the smaller horn section adjacent the junction with larger horn section has a smooth radius transition from 0.250 inch diameter to 0.125 inch diameter.

EXAMPLE 2

A planar probe as described with reference to FIG. 7 is fabricated from titanium with the following dimensions: total length of planar probe 701 having first end 703 and second end 705, 6.86 inch; combined length of upper, thicker portion of planar probe 701 and shoulder supports 707 and 709, 3.10 inch; total length of horn 711, 3.76 inch; thickness of main probe body 713, 0.50 inch; and thickness of horn 711, 0.125 inch. The axial thickness of shoulder supports 707 and 709 is 0.125 inch and the width of shoulder supports 707 and 709 perpendicular to the plane of planar probe 701 is 0.650 inch.

The end of the horn adjacent shoulder supports 707 and 709 has a smooth radius transition from 0.250 inch diameter to 0.125 inch diameter.

EXAMPLE 3

A 3.8 cm×3.8 cm silicon wafer test fragment containing silicon debris particles was cleaned in a small scale reactor similar to that of FIG. 4. The probe body was constructed of Hastelloy® C-276 and had a diameter of 0.25 in at the seal location, a diameter of 0.5 inch between the seal and the transducer, and a diameter of 0.125 in between the seal and the probe tip. The tip of the ultrasonic probe was positioned 6 mm above the wafer surface, the reactor was sealed, and the sealed reactor was charged with carbon dioxide at 3000 psig and 104° F. The ultrasonic transducer was operated at 20 KHz and a power density of approximately 100 W/cm$^2$ for 60 seconds. The system was depressurized and disassembled, and the wafer test fragment was removed and observed. It was seen that more than 90% of the super-micron sized and sub-micron-sized silicon debris particles were removed from the entire chip surface by the ultrasonic cleaning process.

EXAMPLE 4

The procedure of Example 1 was repeated but without the use of ultrasonic energy. It was observed that the silicon debris particles were not removed from the wafer test fragment.

The invention claimed is:

1. An ultrasonic probe assembly comprising (a) a seal assembly comprising a seal body having a first end and a second end, an axis passing through the first end and the second end, and a coaxial cylindrical passage within the seal assembly between the first end and the second end;

(b) An ultrasonic probe comprising an elongate body having a first end and a second end, an ultrasonic transducer attached to the probe at or adjacent the first end, and a cylindrical collar support section intermediate the ultrasonic transducer and the second end, wherein the probe is a cylindrical section with an unchanged diameter between the ultrasonic transducer and the collar support section, the collar support section has a diameter greater than diameter of the cylinder between the ultrasonic transducer and the collar support section, the cylindrical section of the probe is disposed coaxially within the cylindrical passage of the seal body such that the collar support section is adjacent the second end of the seal body, and the diameter of the cylindrical collar support section is greater than the diameter of the cylindrical passage at the second end of the seal body; and (c) an elastomeric torroidal seal ring located at a vibrational node of the ultrasonic probe and disposed coaxially between the collar support section of the ultrasonic probe and the second end of the seal body.

2. The ultrasonic probe assembly of claim 1 wherein the cylindrical section of the ultrasonic probe extends beyond the first end of the seal body and wherein the ultrasonic probe assembly further comprises a compression fitting adapted to grip the ultrasonic probe and the first end of the seal body to maintain the ultrasonic probe in a coaxial position in the cylindrical passage of the seal assembly.

3. The ultrasonic probe assembly of claim 2 wherein the compression fitting includes a torroidal elastomeric ferrule comprising an elastomer selected from the group consisting of tetrafluoroethylene, chlorotrifluoroethylene, polyvinylidene fluoride,perfluoroalkoxy, polyethylene, unplasticized polyvinyl chloride, acrylonitrile butadiene styrene, acetal, cellulose acetate butyrate, nylon, polypropylene, polycarbonate, polyphenylene oxide, polyphenylene sulfide, polysulfone, polyamide, polyimide, thermosetting plastic, natural rubber, hard rubber, chloroprene, neoprene, styrene rubber, nitrile rubber, butyl rubber, silicone rubber, chlorosulfonated polyethylene, polychlorotrifluoroethylene, polyvinyl chloride elastomer, cis-polybutadiene, cis-polyisoprene, ethylene-propylene rubber, carbon, and graphite.

4. The ultrasonic probe assembly of claim 1 wherein the ultrasonic probe comprises a metal or metal alloy.

5. The ultrasonic probe assembly of claim 1 wherein the seal body comprises a metal or metal alloy.

6. The ultrasonic probe assembly of claim 1 wherein the elastomeric torroidal seal ring comprises an elastomer selected from the group consisting of tetrafluoroethylene, chlorotrifluoroethylene, polyvinylidene fluoride, perfluoroalkoxy, polyethylene, unplasticized polyvinyl chloride, acrylonitrile butadiene styrene, acetal, cellulose acetate butyrate, nylon, polypropylene, polycarbonate, polyphenylene oxide, polyphenylene sulfide, polysulfone, polyamide, polyimide, thermosetting plastic, natural rubber, hard rubber, chloroprene, neoprene, styrene rubber, nitrile rubber, butyl rubber, silicone rubber, chlorosulfonated polyethylene, polychlorotrifluoroethylene, polyvinyl chloride elastomer, cis-polybutadiene, cis-polyisoprene, ethylene-propylene rubbers, carbon, and graphite.

7. The ultrasonic probe assembly of claim 1 which further comprises a transducer assembly attached to the first end thereof.

8. An ultrasonic processing system comprising (a) An ultrasonic probe assembly including (1) a seal assembly comprising a seal body having a first end and a second end, an axis passing through the first end and the second end, and a coaxial cylindrical passage disposed between the first end and the second end;

(2) An ultrasonic probe comprising an elongate body having a first end and a second end, an ultrasonic transducer attached to the probe at or adjacent the first end, and a cylindrical collar support section intermediate the ultrasonic transducer and the second end, wherein the probe is a cylindrical section with an unchanged diameter between the ultrasonic transducer and the collar support section, the collar support section has a diameter greater than the diameter of the cylinder between the ultrasonic transducer and the collar support section, the cylindrical section of the probe is disposed coaxially within the cylindrical passage of the seal body such that the collar support section is adjacent the second end of the seal body, and the diameter of the cylindrical collar section is greater than the diameter of the cylindrical passage at the second end of the seal body; and (3) an elastomeric torroidal seal ring located at a vibrational of the ultrasonic probe and disposed coaxially between the collar support section of the ultrasonic probe and the second end of the seal body;

(b) a pressure vessel having an interior, an exterior, and at least one opening between the interior and the exterior; and (c) first sealing means associated with the second end of the seal assembly and second sealing means associated with the at least one opening in the pressure vessel, wherein the first and second sealing means are adapted to form a seal between the seal assembly and the pressure vessel;

wherein the elastomeric torroidal seal ring is compressed between the collar support section and the second end of the seal body to form a seal between the interior and the exterior of the pressure vessel, and wherein the second end of the ultrasonic probe is disposed in the interior of the pressure vessel.

9. The ultrasonic processing system of claim 8 wherein the cylindrical section of the ultrasonic probe extends beyond the first end of the seal body and wherein the ultrasonic probe assembly further comprises a compression fitting adapted to grip the ultrasonic probe and the first end of the seal body to maintain the ultrasonic probe in a coaxial position in the cylindrical passage of the seal assembly.

10. The ultrasonic processing system of claim 8 wherein the ultrasonic probe assembly further comprises a transducer assembly attached to the first end thereof.

11. The ultrasonic processing system of claim 8 wherein the pressure vessel further comprises an inlet for introducing a fresh cleaning fluid into the pressure vessel and an outlet for withdrawing a contaminated cleaning fluid from the pressure vessel.

12. The ultrasonic processing system of claim 8 wherein the pressure vessel further comprises an inlet port for introducing one or more contaminated articles into the pressure vessel and an outlet port for withdrawing one or more cleaned articles from the pressure vessel.

* * * * *